(12) United States Patent
Jairam et al.

(10) Patent No.: US 7,525,331 B1
(45) Date of Patent: Apr. 28, 2009

(54) ON-CHIP CRITICAL PATH TEST CIRCUIT AND METHOD

(75) Inventors: Prabha Jairam, Fremont, CA (US); Himanshu J. Verma, Mountain View, CA (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/043,833

(22) Filed: Mar. 6, 2008

(51) Int. Cl.
*G01R 31/26* (2006.01)

(52) U.S. Cl. .................. 324/763; 324/765; 714/724

(58) Field of Classification Search ............. None
See application file for complete search history.

(56) References Cited

U.S. PATENT DOCUMENTS 6,201,829 B1 * 3/2001 Schneider .............. 375/221
7,308,632 B1 * 12/2007 Verma et al. ............ 714/731

OTHER PUBLICATIONS

U.S. Appl. No. 12/043,825, filed Mar. 6, 2008, Jairam et al.
U.S. Appl. No. 11/498,368, filed Aug. 3, 2006, Jairam et al.

* cited by examiner

*Primary Examiner*—Minh N Tang
(74) *Attorney, Agent, or Firm*—Pablo Meles

(57) ABSTRACT

A test circuit in an integrated circuit (200 or 300) is used for verifying a critical path of a circuit (230) under test. The test circuit can include a sequence generator (202) generating a data signal for the critical path, a source sequential circuit (208) for receiving the data signal coupled to an input of the critical path, a destination sequential circuit (210 or 310) for receiving an output of the critical path, and an analyzer circuit (212 or 312) for verification of timing of the critical path by measuring timing from the source sequential circuit to a clock enable pin (209) or a set/reset pin (309) of the destination sequential circuit. The test circuit can further include a controller circuit (220) for strobing a comparison circuit (218) in the analyzer circuit at a predetermined clock time. The integrated circuit can be part of an FPGA or FPGA fabric.

20 Claims, 7 Drawing Sheets

Fine- CE as buffered path

| Time | s | ce | din | d | A | B | CE |
|---|---|---|---|---|---|---|---|
| 0T | 0 | 0 | 1 | 0 | 0 |   |   |
| 1T | 0 | 0 | 1 | 0 | 0 |   |   |
| 2T | 1 | 0 | 1 | 0 | 0 |   |   |
| 3T | 1 | 1 | 1 | 1 | 0 |   | 1 |
| 4T | 0 | 1 | 0 | 0 | 1 | 0 |   |
| 5T | 0 | 0 | 1 | 0 | 1 | 0 |   |
| 6T | 1 | 0 | 1 | 0 | 1 | 0 | 1 |
| 7T | 1 | 1 | 0 | 1 | 1 | 0 |   |
| 8T | 0 | 1 | 1 | 0 | 1 | 0 |   |

FIG. 4

Fine- CE as inv path

| Time | s | ce | din | d | A | B | CE |
|---|---|---|---|---|---|---|---|
| 0T | 0 | 1 | 1 | 0 | 0 |   |   |
| 1T | 0 | 1 | 1 | 1 | 0 |   |   |
| 2T | 1 | 1 | 0 | 0 | 1 |   |   |
| 3T | 1 | 0 | 1 | 0 | 1 |   | 1 |
| 4T | 0 | 0 | 1 | 0 | 1 | 0 |   |
| 5T | 0 | 1 | 1 | 1 | 1 | 0 |   |
| 6T | 1 | 1 | 0 | 0 | 1 | 0 | 1 |
| 7T | 1 | 0 | 1 | 0 | 1 | 0 |   |
| 8T | 0 | 0 | 1 | 0 | 1 | 0 |   |

1late, buf, & 0 winning

| Time | s | ce | din | d | A | B | CE |
|------|---|----|----|---|---|---|----|
| 0T | 0 | 0 | 1 | 0 | 0 | | |
| 1T | 0 | 0 | 1 | 0 | 0 | | |
| 2T | 1 | 0 | 1 | 0 | 0 | | |
| 3T | 1 | 0 | 1 | 0 | 0 | | 1 |
| 4T | 0 | 1 | 1 | 1 | 0 | 1 | |
| 5T | 0 | 0 | 0 | 1 | 1 | 1 | 1 |
| 6T | 1 | 0 | 0 | 1 | 1 | 1 | |
| 7T | 1 | 0 | 0 | 1 | 1 | 1 | |

FIG. 7

1late, buf, & 1 winning

| Time | s | ce | din | d | A | B | CE |
|------|---|----|----|---|---|---|----|
| 0T | 0 | 0 | 1 | 0 | 0 | | |
| 1T | 0 | 0 | 1 | 0 | 0 | | |
| 2T | 1 | 0 | 1 | 0 | 0 | | |
| 3T | 1 | 0 | 1 | 0 | 0 | | 1 |
| 4T | 0 | 1 | 1 | 1 | 0 | 1 | |
| 5T | 0 | 1 | 0 | 0 | 1 | 1 | |
| 6T | 1 | 0 | 1 | 0 | 1 | 1 | 1 |
| 7T | 1 | 0 | 1 | 0 | 1 | 1 | |

FIG. 9

1late, inv, & 1 winning

| Time | s | ce | din | d | A | B | CE |
|------|---|----|----|---|---|---|-----|
| 0T | 0 | 1 | 1 | 0 | 0 | | |
| 1T | 0 | 1 | 1 | 1 | 0 | | |
| 2T | 1 | 1 | 0 | 0 | 1 | | |
| 3T | 1 | 1 | 1 | 1 | 1 | | 1 |
| 4T | 0 | 0 | 0 | 1 | 1 | 1 | |
| 5T | 0 | 0 | 0 | 1 | 1 | 1 | |
| 6T | 1 | 1 | 0 | 0 | 1 | 1 | 1 |
| 7T | 1 | 1 | 1 | 1 | 1 | 1 | |

FIG. 8

1late, inv, & 0 winning

| Time | s | ce | din | d | A | B | CE |
|------|---|----|----|---|---|---|-----|
| 0T | 0 | 1 | 1 | 0 | 0 | | |
| 1T | 0 | 1 | 1 | 1 | 0 | | |
| 2T | 1 | 1 | 0 | 0 | 1 | | |
| 3T | 1 | 1 | 1 | 1 | 1 | | 1 |
| 4T | 0 | 0 | 0 | 1 | 1 | 1 | |
| 5T | 0 | 1 | 0 | 1 | 1 | 1 | |
| 6T | 1 | 1 | 1 | 1 | 1 | 1 | 1 |
| 7T | 1 | 1 | 0 | 0 | 1 | 1 | |

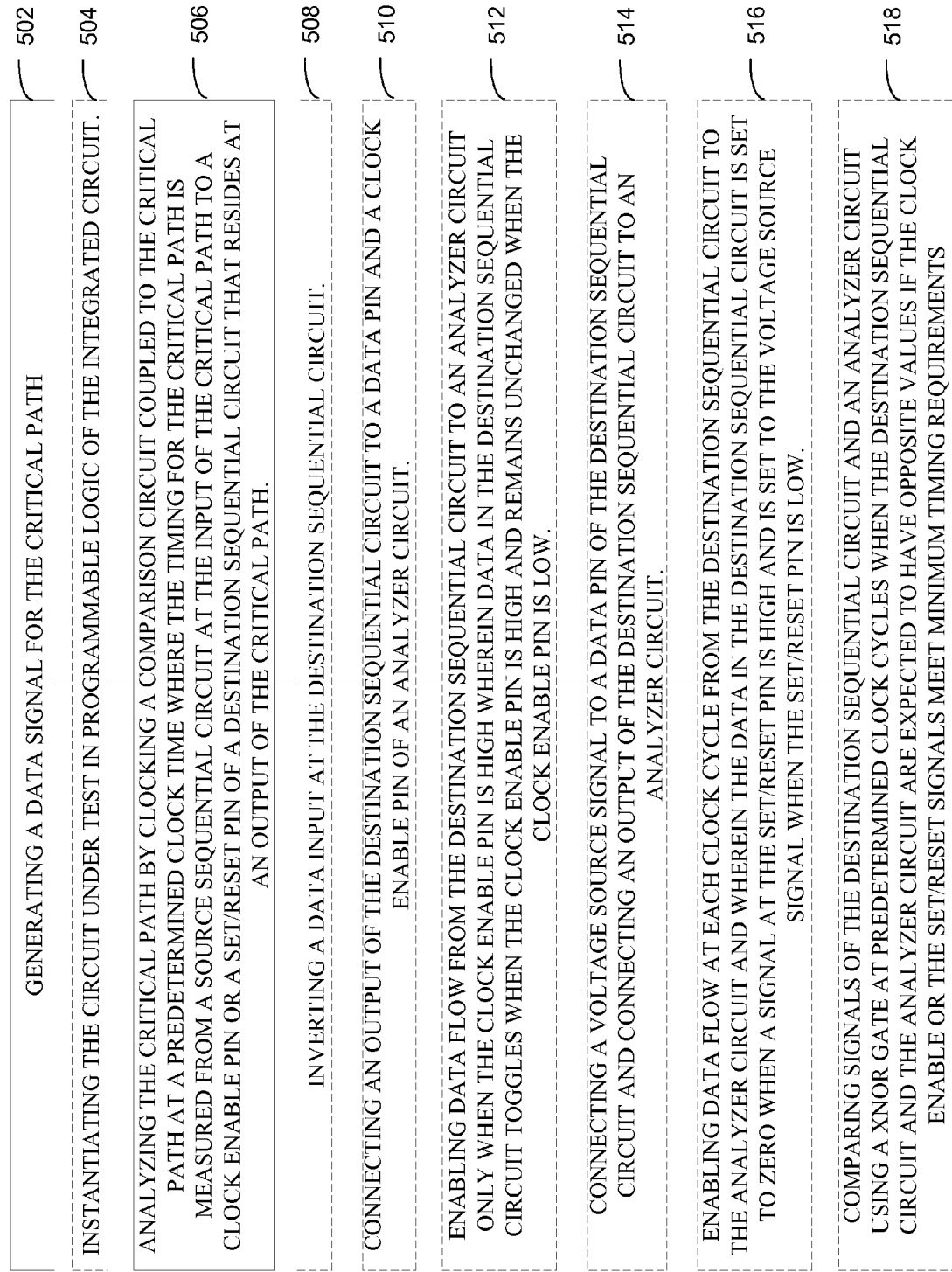

FIG. 10  500

502 — GENERATING A DATA SIGNAL FOR THE CRITICAL PATH

504 — INSTANTIATING THE CIRCUIT UNDER TEST IN PROGRAMMABLE LOGIC OF THE INTEGRATED CIRCUIT.

506 — ANALYZING THE CRITICAL PATH BY CLOCKING A COMPARISON CIRCUIT COUPLED TO THE CRITICAL PATH AT A PREDETERMINED CLOCK TIME WHERE THE TIMING FOR THE CRITICAL PATH IS MEASURED FROM A SOURCE SEQUENTIAL CIRCUIT AT THE INPUT OF THE CRITICAL PATH TO A CLOCK ENABLE PIN OR A SET/RESET PIN OF A DESTINATION SEQUENTIAL CIRCUIT THAT RESIDES AT AN OUTPUT OF THE CRITICAL PATH.

508 — INVERTING A DATA INPUT AT THE DESTINATION SEQUENTIAL CIRCUIT.

510 — CONNECTING AN OUTPUT OF THE DESTINATION SEQUENTIAL CIRCUIT TO A DATA PIN AND A CLOCK ENABLE PIN OF AN ANALYZER CIRCUIT.

512 — ENABLING DATA FLOW FROM THE DESTINATION SEQUENTIAL CIRCUIT TO AN ANALYZER CIRCUIT ONLY WHEN THE CLOCK ENABLE PIN IS HIGH WHEREIN DATA IN THE DESTINATION SEQUENTIAL CIRCUIT TOGGLES WHEN THE CLOCK ENABLE PIN IS HIGH AND REMAINS UNCHANGED WHEN THE CLOCK ENABLE PIN IS LOW.

514 — CONNECTING A VOLTAGE SOURCE SIGNAL TO A DATA PIN OF THE DESTINATION SEQUENTIAL CIRCUIT AND CONNECTING AN OUTPUT OF THE DESTINATION SEQUENTIAL CIRCUIT TO AN ANALYZER CIRCUIT.

516 — ENABLING DATA FLOW AT EACH CLOCK CYCLE FROM THE DESTINATION SEQUENTIAL CIRCUIT TO THE ANALYZER CIRCUIT AND WHEREIN THE DATA IN THE DESTINATION SEQUENTIAL CIRCUIT IS SET TO ZERO WHEN A SIGNAL AT THE SET/RESET PIN IS HIGH AND IS SET TO THE VOLTAGE SOURCE SIGNAL WHEN THE SET/RESET PIN IS LOW.

518 — COMPARING SIGNALS OF THE DESTINATION SEQUENTIAL CIRCUIT AND AN ANALYZER CIRCUIT USING A XNOR GATE AT PREDETERMINED CLOCK CYCLES WHEN THE DESTINATION SEQUENTIAL CIRCUIT AND THE ANALYZER CIRCUIT ARE EXPECTED TO HAVE OPPOSITE VALUES IF THE CLOCK ENABLE OR THE SET/RESET SIGNALS MEET MINIMUM TIMING REQUIREMENTS

ON-CHIP CRITICAL PATH TEST CIRCUIT AND METHOD

FIELD OF THE INVENTION

The invention relates to integrated circuit devices (ICs). More particularly, the invention relates to a test circuit for verifying a critical path for an IC.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth. As used herein, note that the terms "include" and "including" mean including without limitation.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

For purposes of clarity, FPGAs are described below though other types of PLDs may be used. FPGAs may include one or more embedded microprocessors. For example, a microprocessor may be located in an area reserved for it, generally referred to as a "processor block."

The testing of performance of a design instantiated in programmable logic of an FPGA ("FPGA fabric") was premised on fully programmable parts. However, as partially programmable parts may be used for some designs, testing of such designs in an FPGA that is partially programmable has become more problematic. As such, it would be desirable to provide a means for testing a design implemented in a partially programmable FPGA to verify functionality of the programmable logic employed.

SUMMARY OF THE INVENTION

One or more aspects of the invention generally relate to integrated circuits, and more particularly, to testing of integrated circuits.

In accordance with a first embodiment of the invention, a test circuit in an integrated circuit is used for verifying a critical path of a circuit under test. The test circuit can include a sequence generator generating a data signal for the critical path, a source sequential circuit for receiving the data signal coupled to an input of the critical path, a destination sequential circuit for receiving an output of the critical path, and an analyzer circuit for verification of timing of the critical path by measuring timing from the source sequential circuit to a clock enable pin or a set/reset pin of the destination sequential circuit. The test circuit can further include a controller circuit for strobing a comparison circuit in the analyzer circuit at a predetermined clock time.

In accordance with a second embodiment of the invention, a method of on-chip verification of a critical path of a circuit under test on an integrated circuit can include the steps of generating a data signal for the critical path and analyzing the critical path by clocking a comparison circuit coupled to the critical path at a predetermined clock time. Note, a timing for the critical path is measured from a source sequential circuit at the input of the critical path to a clock enable pin or a set/reset pin of a destination sequential circuit that resides at an output of the critical path.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 4-5 illustrate a number of exemplary timing charts where a critical path meets a timing constraint in accordance with an embodiment of the present invention.

FIGS. 6-9 illustrate a number of exemplary timing charts where a critical path delay fails to meet a timing constraint in accordance with an embodiment of the present invention.

FIG. 10 is a flow chart illustrating a method of on-chip verification of a critical path of a circuit under test in accordance with an embodiment of the present invention.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
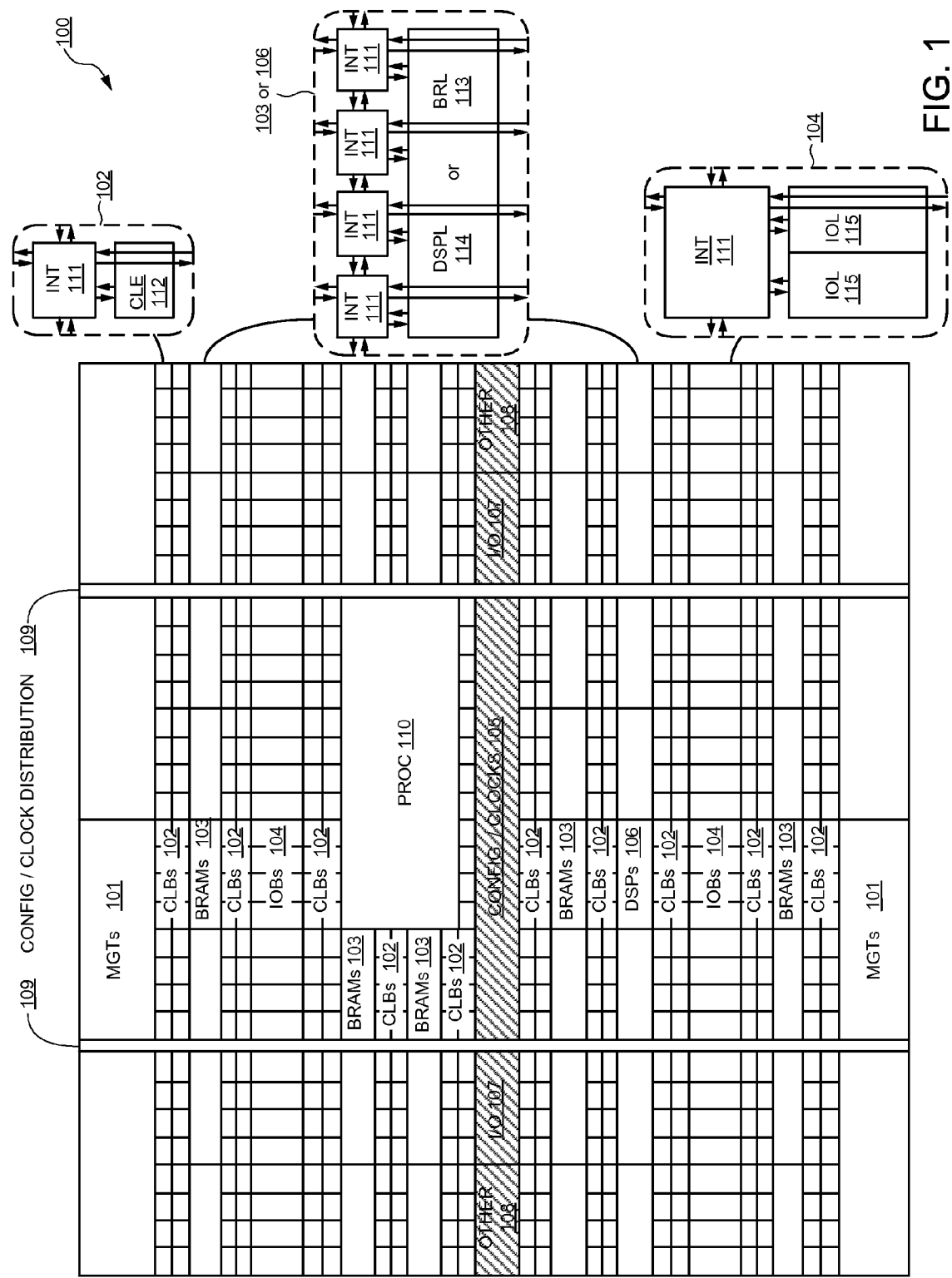
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several types of programmable logic blocks in the array. For example, FIG. 1 illustrates an FPGA architecture 100 that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output ports (I/O) 107 (e.g., configuration ports and clock ports), and other programmable logic 108 such as digital clock managers, analog-to-digital converters, system monitoring logic, and so forth. Some FPGAs also include dedicated processor blocks (PROC) 110.

In some FPGAs, each programmable tile includes a programmable interconnect element (INT) 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element (CLE) 112 that can be programmed to implement user logic plus a single programmable interconnect element 111. A BRAM 103 can include a BRAM logic element (BRL 113) in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the right of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
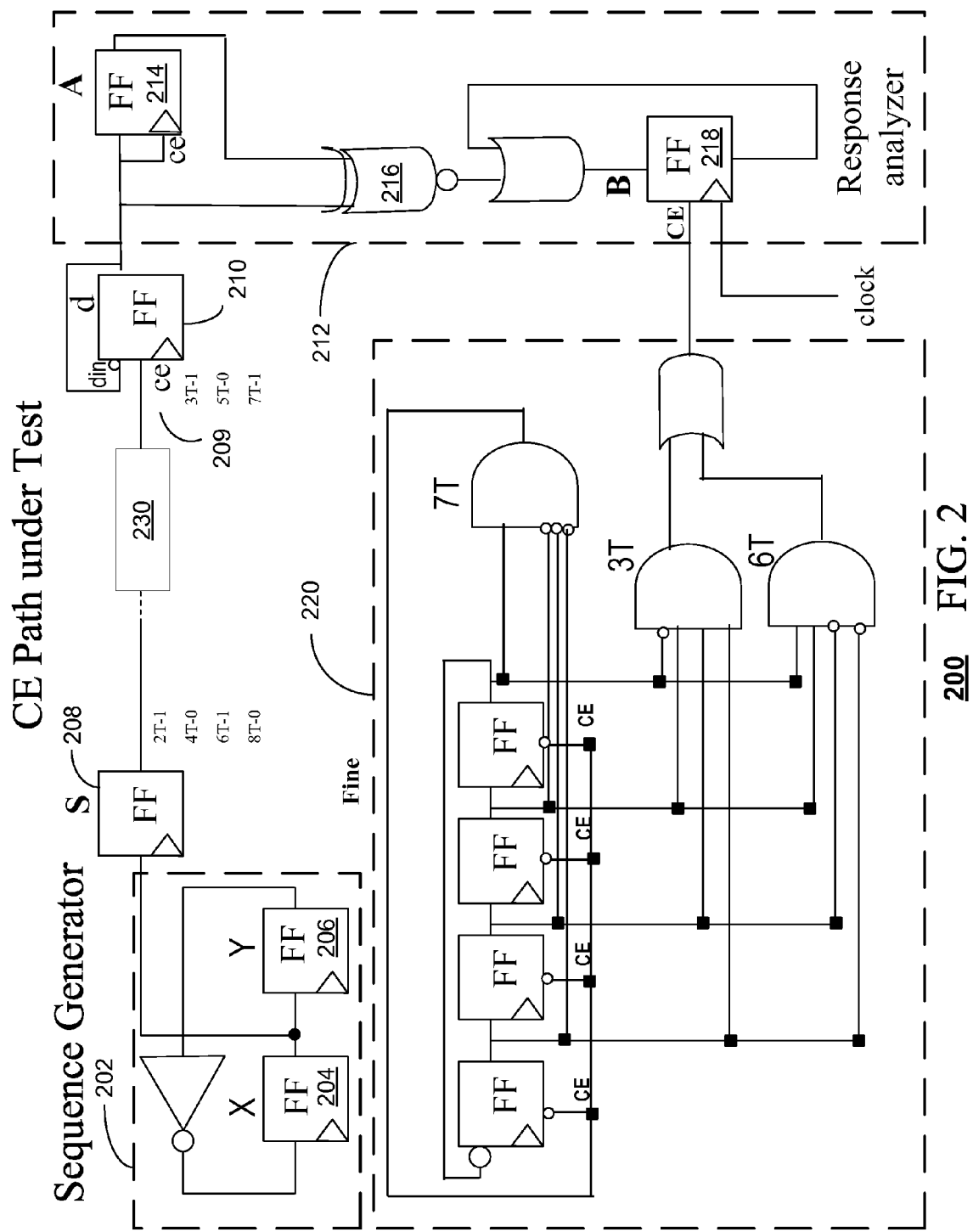
FIG. 2 is a block/schematic diagram depicting an exemplary embodiment of a test jig for verifying timing between a source sequential circuit and a clock enable pin of a destination sequential circuit.

Referring to FIG. 2, a test circuit in an integrated circuit 200 is used for verifying a critical path of a circuit under test 230. As is known, a "critical path" is generally considered a speed-limiting path with respect to a frequency of operation of a user design. The test circuit here is used to test a user design "critical path". The critical path can include a source sequential circuit 208, the circuit under test 230 as well as a destination sequential circuit 210. The sequential circuits described here can be flip flops. Thus, the user design critical path starts with a flip-flop and ends with a flip-flop and such flip-flops as well as combinational logic in the form of a user design circuit (230), may be in programmable logic of an FPGA and, more particularly, may be within FPGA fabric, or one or more IOBs, or any combination thereof. For example, a series of gates may be considered more than one logic level. Combinational logic in the circuit under test 230 may be one or more levels of combinational logic. Notably, none of the circuitry in combinational logic includes clocked circuits such as flip-flops, namely sequential circuits.

As is known, a design may be tested for timing violations using static timing analysis tools. Static timing analysis may be used to identify a critical path. Notably, there may be more than one critical path within a design to be tested. However, for purposes of clarity and not limitation, only a single critical path is described with reference to FIG. 2. The test circuit can include a sequence generator 202 generating a data signal for the critical path, the source sequential circuit 208 for receiving the data signal coupled to an input of the critical path, the destination sequential circuit 210 for receiving an output of the critical path, and an analyzer circuit 212 for verification of timing of the critical path by measuring timing from the source sequential circuit 208 to a clock enable pin 209 (or a set/reset pin 309 of FIG. 3) of the destination sequential circuit 210. The sequence generator 202 can be a clock divide by 4 counter, for example, that generates the data signal for the critical path. In general, any form of circuit capable of providing a test pattern as one or more data inputs may be used. The test circuit can further include a controller circuit 220 for strobing a comparison circuit 218 in the analyzer circuit at a predetermined clock time. The test circuit 200 can be clocked using an on-chip digital clock manager (DCM) at a frequency predicted by a static timing analysis tool. Other clocking devices or methods can be used, including external automatic test equipment (ATE) timing devices to clock the test circuit 200 and the embodiments herein are not necessarily limited to using a DCM. As shown in FIG. 2, the destination sequential circuit 210 can also include a feedback loop from an output of the destination sequential circuit 210 to invert a data input (din) at the destination sequential circuit. The output of the destination sequential circuit 210 is connected to a data pin and a clock enable pin of the analyzer circuit 212 and more particularly to the data pin and clock enable pin of a sequential circuit 214 of the analyzer circuit 212.

Operationally, the data in the destination sequential circuit 210 toggles when the clock enable pin is high and remains unchanged when the clock enable pin is low. Further note, data flows from the destination sequential circuit 210 to the analyzer circuit 212 only when the clock enable pin is high.

Figure 3:
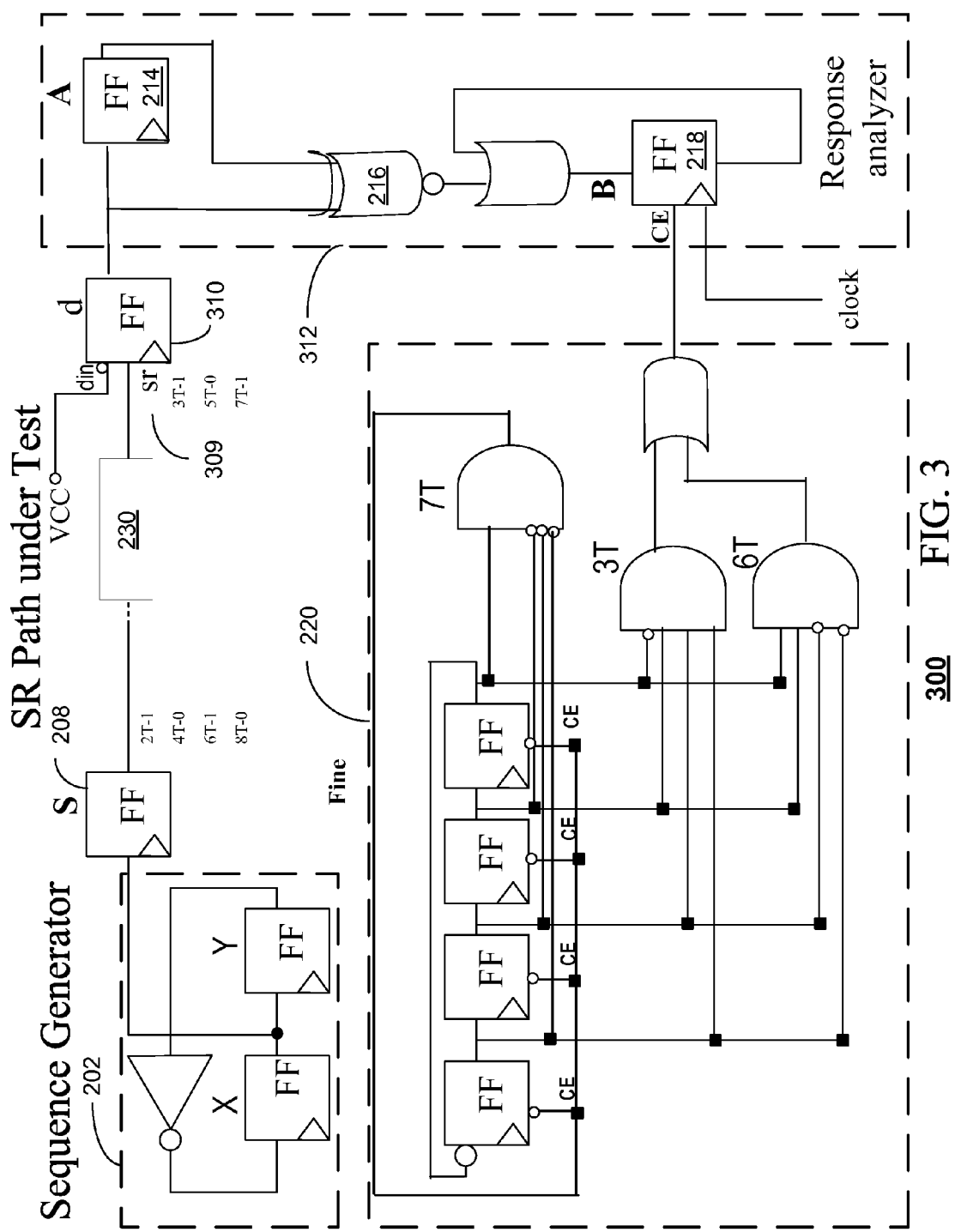
FIG. 3 is a block/schematic diagram depicting an exemplary embodiment of a test jig for verifying timing between a source sequential circuit and a Set/Reset pin of a destination sequential circuit.

Referring to FIG. 3, another integrated circuit 300 is illustrated that is similar to the integrated circuit 200 except that the critical path timing is measured from the source sequential circuit 208 to a set/reset pin 309 of a destination sequential circuit 310. In most other respects, the integrated circuit 300 is the same as the integrated circuit 200. As in circuit 200, the critical path in circuit 300 can include the source sequential circuit 208, the circuit under test 230 as well as the destination sequential circuit 310. The test circuit can include a sequence generator 202 generating a data signal for the critical path, the source sequential circuit 208 for receiving the data signal coupled to an input of the critical path, the destination sequential circuit 310 for receiving an output of the critical path, and an analyzer circuit 312 for verification of timing of the critical path by measuring timing from the source sequential circuit 208 to the set/reset pin of the destination sequential circuit 310 as previously noted. The test circuit can further include a controller circuit 220 for strobing a comparison circuit 218 in the analyzer circuit at a predetermined clock time. In integrated circuit 300, a voltage source signal (VCC) is connected to a data pin (din) of the destination sequential circuit 310 and an output of the destination sequential circuit 310 is connected to the analyzer circuit 312. In both circuits 200 and 300, the circuit under test 230 and the test circuit are instantiated in programmable logic of the integrated circuit.

Operationally, the test circuit of integrated circuit 300 has data flows at each clock cycle from the destination sequential circuit 310 to the analyzer circuit 312. The destination sequential circuit 310 is set to zero when a signal at the set/reset pin is high and is set to the voltage source signal (VCC) when the set/reset pin is low.

Referring again to FIGS. 2 and 3, the analyzer circuit 212 or 312 can be clocked at a frequency predicted by a static timing analysis tool for the critical path. The signals of the destination sequential circuit 210 (or 310) and the analyzer circuit (212 or 312) are compared using a XNOR gate 216 at predetermined clock cycles when the destination sequential circuit and the analyzer circuit are expected to have opposite values if the clock enable or the set/reset signals meet minimum timing requirements. The specific clock cycles are determined by the controller circuit 220 which asserts at an appropriate clock instant of time. If the signals at the destination sequential circuit 210 or 310 and the analyzer circuit (212 or 312) have the same values, the implication is that the clock enable (ce) or the Set/Reset (sr) signal did not pass a critical timing requirement. In such instances, the results of the XNOR gate 216 is "1" and this result is captured as a sticky-bit in the comparison circuit 218 or flip-flop which retains its value until the end of the test as demonstrated in the following timing tables in FIGS. 6-9. The timing table in FIG. 4 provides an example where a critical path meets a timing constraint where timing to the clock enable pin (of the Flip flop 210, see FIG. 2) is a buffered path. A buffered path is a path where a rising (or falling) signal at the source flip flop 208 arrives as a rising (or falling) signal at the clock enable pin 208 or the set/reset pin 309 arrives at the destination flip flop 210 (or 310) after passing through the combinational logic (or circuit under test) 230 in the critical path. The timing table in FIG. 5 illustrates a critical path that meets a timing constraint where timing to the clock enable pin (of the Flip flop 210, see FIG. 2) serves as an inverted path. An inverted path is one where a rising (or falling) signal at the source flip flop 208 arrives as a falling (or rising) signal at the clock enable pin 209 (or the set/reset pin 309) arrives at the destination flip flop 210 (or 310) after passing through the combinational logic (or circuit under test) 230 in the critical path.

In the timing tables of FIGS. 4-9, T=the time period of the clock, where events happen at time T, 2T, 3T, and other like time instances. The events can be described as flip-flops or pins changing their values where the events start at the beginning of each time instance. By the end of a time period, flip-flops and pins are expected to attain stable values. With respect to FIG. 6, a timing table illustrates a critical path delay that fails to meet a timing constraint as evidence by the value "1" in the B flip-flop. This particular failure is caused by a late "1" at the "ce" or clock enable pin of the destination sequential circuit or flip flop 210 (see FIG. 2) in a buffered path where the "0" is winning (or wins) in the event there is a contention between 1 reaching "ce" at time 5T (issued at 3T, arrived late at 5T) and 0 reaching at time 5T (issued at time 4T, arrived on-time at 5T). In FIG. 7, a timing table illustrates a critical path delay that fails to meet a timing constraint as evidence by the value "1" in the B flip-flop and where the failure is caused by a late "1" at the "ce" or clock enable pin of the destination sequential circuit or flip flop 210 in a buffered path where the "1" is winning (or wins) in the event there is a contention between 1 reaching "ce" at time 5T (issued at 3T, arrived late at 5T) and 0 reaching at time 5T (issued at time 4T, arrived on-time at 5T). With respect to FIG. 8, a timing table illustrates a critical path delay that fails to meet a timing constraint where the failure is caused by a late "1" at the ce or clock enable pin of the destination path in an inverted path where "0" is winning (or wins) in the event there is a contention between 1 reaching "ce" at time 5T (issued at 4T, arrived on-time at 5T) and 1 reaching at time 5T (issued at 3T, arrived late at 5T). In FIG. 9, the timing table illustrates a critical path delay that fails to meet a timing constraint where the failure is caused by a late "1" at the ce or clock enable pin of the destination path in an inverted path where "1" is winning (or wins) in the event there is a contention between 1 reaching "ce" at time 5T (issued at 4T, arrived on-time at 5T) and 1 reaching at time 5T (issued at 3T, arrived late at 5T).

Referring to FIG. 10, a flow chart illustrating a method 500 of on-chip verification of a critical path of a circuit under test on an integrated circuit can include the step 502 of generating a data signal for the critical path and analyzing the critical path at step 506 by clocking a comparison circuit coupled to the critical path at a predetermined clock time where the timing for the critical path is measured from a source sequential circuit at the input of the critical path to a clock enable pin or a set/reset pin of a destination sequential circuit that resides at an output of the critical path. The method can optionally instantiate at step 504 the circuit under test in programmable logic of the integrated circuit. In one embodiment, the method can invert a data input at the destination sequential circuit at step 508. The method can also connect an output of the destination sequential circuit to a data pin and a clock enable pin of an analyzer circuit at step 510. When using the clock enable pin, the method at step 512 can enable data flow from the destination sequential circuit to an analyzer circuit only when the clock enable pin is high where data in the destination sequential circuit toggles when the clock enable pin is high and remains unchanged when the clock enable pin is low. In another embodiment, the method can connect a voltage source signal (VCC) to a data pin of the destination sequential circuit and connect an output of the destination sequential circuit to an analyzer circuit at step 514. When using VCC, the method can enable data flow at each clock cycle from the destination sequential circuit to the analyzer circuit where the data in the destination sequential circuit is set to zero when a signal at the set/reset pin is high and is set to the voltage source signal (VCC) when the set/reset (sr) pin is low at step 516. The method 500 can further include the step 518 of comparing signals of the destination sequential circuit and an analyzer circuit using a XNOR gate at predetermined clock cycles when the destination sequential circuit and the analyzer circuit are expected to have opposite values if the clock enable or the set/reset signals meet minimum timing requirements.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps.

What is claimed is:

1. A test circuit in an integrated circuit for verifying a critical path of a circuit under test, comprising:
    a sequence generator generating a data signal for the critical path;
    a source sequential circuit for receiving the data signal coupled to an input of the critical path;
    a destination sequential circuit for receiving an output of the critical path;
    an analyzer circuit for verification of timing of the critical path by measuring timing from the source sequential circuit to a clock enable pin or a set/reset pin of the destination sequential circuit; and
    a controller circuit for strobing a comparison circuit in the analyzer circuit at a predetermined clock time.

2. The test circuit of claim 1, wherein the destination sequential circuit further includes a feedback loop from an output of the destination sequential circuit to invert a data input at the destination sequential circuit.

3. The test circuit of claim 1, wherein the output of the destination sequential circuit is connected to a data pin and a clock enable pin of the analyzer circuit.

4. The test circuit of claim 2, wherein data in the destination sequential circuit toggles when the clock enable pin is high and remains unchanged when the clock enable pin is low.

5. The test circuit of claim 4, wherein data flows from the destination sequential circuit to the analyzer circuit only when the clock enable pin is high.

6. The test circuit of claim 1, wherein a voltage source signal is connected to a data pin of the destination sequential circuit and an output of the destination sequential circuit is connected to the analyzer circuit.

7. The test circuit of claim 6, wherein the data flows at each clock cycle from the destination sequential circuit to the analyzer circuit.

8. The test circuit of claim 6, wherein the data in the destination sequential circuit is set to zero when a signal at the set/reset pin is high and is set to the voltage source signal when the set/reset pin is low.

9. The test circuit of claim 1, wherein the analyzer circuit is clocked at a frequency predicted by a static timing analysis tool for the critical path.

10. The test circuit of claim 1, wherein signals of the destination sequential circuit and the analyzer circuit are compared using a XNOR gate at predetermined clock cycles when the destination sequential circuit and the analyzer circuit are expected to have opposite values if the clock enable or the set/reset signals meet minimum timing requirements.

11. The test circuit of claim 1, wherein the circuit under test and the test circuit are instantiated in programmable logic of the integrated circuit.

12. The test circuit of claim 1, wherein the circuit under test and the test circuit are clocked using a digital clock manager clocked at a frequency predicted by a static timing analysis tool.

13. A method of on-chip verification of a critical path of a circuit under test on an integrated circuit, comprising the steps of:
    generating a data signal for the critical path, wherein a timing for the critical path is measured from a source sequential circuit at the input of the critical path to a clock enable pin or a set/reset pin of a destination sequential circuit that resides at an output of the critical path; and
    analyzing the critical path by clocking a comparison circuit coupled to the critical path at a predetermined clock time.

14. The method of claim 13, wherein the method further comprises the step of instantiating the circuit under test in programmable logic of the integrated circuit.

15. The method of claim 13, wherein the method further comprises the step of inverting a data input at the destination sequential circuit.

16. The method of claim 13, wherein the method further comprises the step of connecting an output of the destination sequential circuit to a data pin and a clock enable pin of an analyzer circuit.

17. The method of claim 16, wherein data in the destination sequential circuit toggles when the clock enable pin is high and remains unchanged when the clock enable pin is low and data flows from the destination sequential circuit to an analyzer circuit only when the clock enable pin is high.

18. The method of claim 13, wherein a voltage source signal is connected to a data pin of the destination sequential circuit and an output of the destination sequential circuit is connected to an analyzer circuit.

19. The method of claim 18, wherein the data flows at each clock cycle from the destination sequential circuit to the analyzer circuit and wherein the data in the destination sequential circuit is set to zero when a signal at the set/reset pin is high and is set to the voltage source signal when the set/reset pin is low.

20. The method of claim 13, wherein the method further comprises the step of comparing signals of the destination sequential circuit and an analyzer circuit using a XNOR gate at predetermined clock cycles when the destination sequential circuit and the analyzer circuit are expected to have opposite values if the clock enable or the set/reset signals meet minimum timing requirements.

* * * * *